United States Patent
Lin et al.

(10) Patent No.: US 8,253,167 B2
(45) Date of Patent: Aug. 28, 2012

(54) METHOD FOR FORMING ANTIMONY-BASED FETS MONOLITHICALLY

(75) Inventors: Heng-Kuang Lin, Ju-Bei (TW);
 Pei-Chin Chiu, Yanshui Township (TW);
 Jen-Inn Chyi, Pingzhen (TW);
 Han-Chieh Ho, Kaohsiung (TW);
 Clement Hsingjen Wann, Carmel, NY (US); Chih-Hsin Ko, Fongshan (TW);
 Cheng-Hsien Wu, Taipei (TW)

(73) Assignees: Taiwan Semiconductor Manufacturing Company, Ltd., Hsin-Chu (TW);
 National Central University, Jhongli (TW)

( * ) Notice: Subject to any disclaimer, the term of this patent is extended or adjusted under 35 U.S.C. 154(b) by 276 days.

(21) Appl. No.: 12/694,002

(22) Filed: Jan. 26, 2010

(65) Prior Publication Data
 US 2011/0180846 A1    Jul. 28, 2011

(51) Int. Cl.
 *H01L 27/092* (2006.01)
(52) U.S. Cl. . 257/190; 257/192; 257/194; 257/E29.248; 257/E29.249
(58) Field of Classification Search ............. 257/190, 257/192, 194, E29.248, E29.249
 See application file for complete search history.

(56) References Cited

U.S. PATENT DOCUMENTS

| 6,054,729 | A | 4/2000 | Berenz |
| 7,429,747 | B2 | 9/2008 | Hudait et al. |
| 2007/0138565 | A1* | 6/2007 | Datta et al. ............ 257/369 |
| 2011/0140087 | A1* | 6/2011 | Hellings et al. ........ 257/24 |
| 2011/0297916 | A1* | 12/2011 | Bennett et al. ........ 257/24 |

OTHER PUBLICATIONS

Bennett, B. R., et al., "Mobility Enhancement in Strained *p*-InGaSb Quantum Wells," Applied Physics Letters, vol. 91, No. 042104, 2007, pp. 042104-1-042104-3.
Chau, R., et al., "Opportunities and Challenges of III-V Nanoelectronics for Future High-Speed, Low-Power Logic Applications," CSIC 2005 Digest, IEEE, 2005, pp. 17-20.
Yoh, K., et al., "Complementary InAs n-Channel and GaSb p-Channel Quantum Well Heterojunction Field-Effect Transistors," Japanese Journal of Applied Physics, vol. 30, No. 12B, Dec. 1991, pp. 3833-3836.

* cited by examiner

*Primary Examiner* — Minh-Loan T Tran
(74) *Attorney, Agent, or Firm* — Slater & Matsil, L.L.P.

(57) ABSTRACT

An integrated circuit structure includes a substrate and a first and a second plurality of III-V semiconductor layers. The first plurality of III-V semiconductor layers includes a first bottom barrier over the substrate; a first channel layer over the first bottom barrier; and a first top barrier over the first channel layer. A first field-effect transistor (FET) includes a first channel region, which includes a portion of the first channel layer. The second plurality of III-V semiconductor layers is over the first plurality of III-V semiconductor layers and includes a second bottom barrier; a second channel layer over the second bottom barrier; and a second top barrier over the second channel layer. A second FET includes a second channel region, which includes a portion of the second channel layer.

20 Claims, 6 Drawing Sheets

METHOD FOR FORMING ANTIMONY-BASED FETS MONOLITHICALLY

TECHNICAL FIELD

This disclosure relates generally to integrated circuit structures and more particularly to complementary field-effect transistors (FETs) comprising III-V compound semiconductors and methods for forming the same.

BACK-GROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (commonly known as III-V compound semiconductors) are good candidates for forming NMOS transistors for their high electron mobility. Therefore, III-V compound semiconductors have been used to form NMOS transistors. To reduce the manufacturing costs, methods for forming PMOS transistors using III-V compound semiconductors have also been explored. However, implementing PMOS transistors and NMOS transistors comprising III-V compound semiconductors on a same chip faces challenges. It is difficult to find III-V compound semiconductor materials having satisfactory electron and hole mobilities. Further, the manufacturing costs for integrating the PMOS and NMOS transistors on a same chip also need to be lowered.

SUMMARY

In accordance with one aspect of the disclosure, an integrated circuit structure includes a substrate and a first and a second plurality of III-V semiconductor layers. The first plurality of III-V semiconductor layers includes a first bottom barrier over the substrate; a first channel layer over the first bottom barrier; and a first top barrier over the first channel layer. A first field-effect transistor (FET) includes a first channel region, which includes a portion of the first channel layer. The second plurality of III-V semiconductor layers is over the first plurality of III-V semiconductor layers and includes a second bottom barrier; a second channel layer over the second bottom barrier; and a second top barrier over the second channel layer. A second FET includes a second channel region, which includes a portion of the second channel layer.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the invention.

Novel complementary field-effect transistors (FETs) comprising compound semiconductor materials of group III and group V elements (referred to as III-V (compound) semiconductors hereinafter), and the methods of forming the same, are provided. The intermediate stages in the manufacturing of the embodiments are illustrated. The variations of the embodiments are discussed. Throughout the various views and illustrative embodiments, like reference numbers are used to designate like elements.

Figure 1:
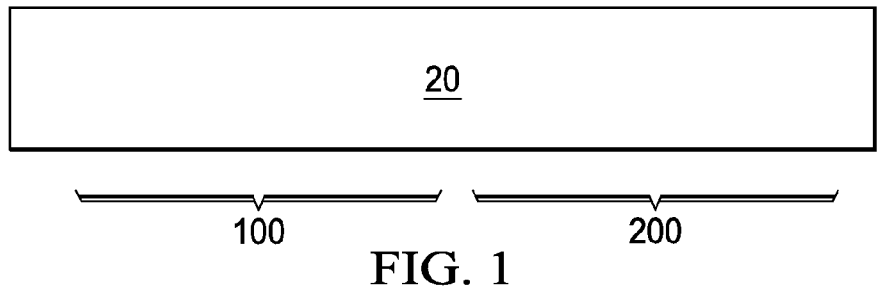
FIGS. 1 through 5 are cross-sectional views of intermediate stages in the manufacturing of complementary field-effect transistors (FETs) in accordance with an embodiment.
Figure 2A:
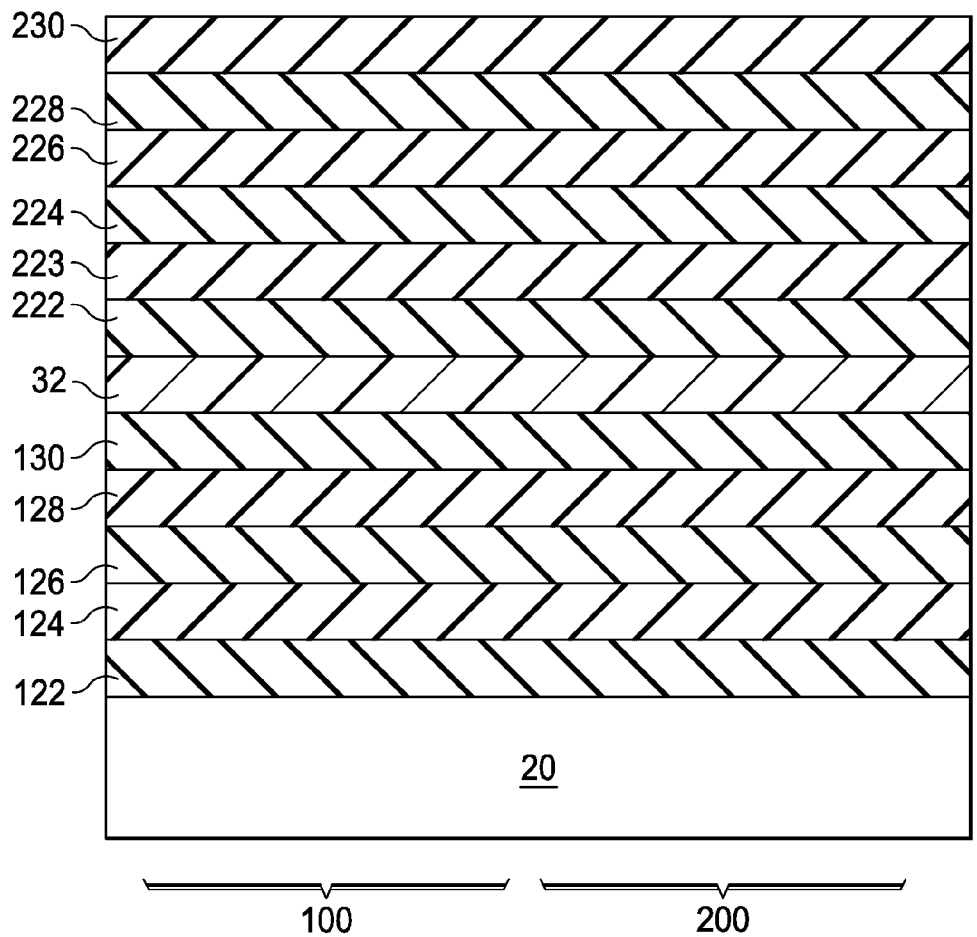

Referring to FIG. 1, substrate 20 is provided. Substrate 20 may be a semiconductor substrate formed of silicon, GaP, GaAs, AlAs, InP, and/or other semiconductor materials. The lattice constant of substrate 20 may be smaller than the lattice constants of the layers for forming PFET transistors (for example, channel layer 226 as shown in FIG. 2A). In an embodiment, the lattice constant of substrate 20 may be smaller than about 6.0 Å. Substrate 20 may include a first portion in first device region 100 and a second portion in second device region 200.

Next, as shown in FIG. 2A, a plurality of layers, which may be formed of compound semiconductor materials, is epitaxially grown on substrate 20. In an embodiment, the plurality of layers includes a first group of layers, and a second group of layers over the first group of layers. The first group of layers includes buffer layer 122, bottom barrier 124, channel layer 126, top barrier 128, and cap layer 130. In an embodiment, channel layer 126 has a first bandgap, while bottom barrier 124 and top barrier 128 have a second bandgap(s) greater than the first bandgap. Accordingly, layers 124, 126, and 128 form a quantum well. In an exemplary embodiment, the second bandgap is greater than the first bandgap by about 0.1 eV, although higher or lower bandgap differences may also apply. The second group of layers includes buffer layer 222, back-ground layer 223 (for applying bias voltages), bottom barrier 224, channel layer 226, top barrier 228, and cap layer 230. Similarly, channel layer 226 may have a third bandgap, while bottom barrier 224 and top barrier 228 may have a fourth bandgap greater than the third bandgap. Accordingly, layers 224, 226, and 228 form a quantum well. In an exemplary embodiment, the second bandgap is greater than the first bandgap by about 0.1 eV, although higher or lower bandgap differences may also apply. The formation of the first and the second group of layers includes epitaxial growth, which includes commonly used chemical vapor deposition methods.

In an exemplary embodiment, the first group of layers may be formed of III-V compound semiconductor materials, such as antimony(Sb)-based materials. For example, channel layer 126 may be formed of InAsSb, while buffer layer 122, bottom barrier 124, top barrier 128, and cap layer 130 may be formed of InGaAlSb, although the compositions and the process conditions for forming these layers may still be different from each other. For example, buffer layer 122 may be formed at a temperature lower than the temperature for forming bottom barrier 124. Top barrier 128 and cap layer 130 may be doped with an n-type impurity, or an impurity, such as Te or Si, that will cause the resulting top barrier 128 and cap layer 130 to be of n-type, while channel layer 126 and bottom barrier 124 may be, or may not be, doped with any n-type impurity. Cap layer 130 (which is a contact layer) may have a smaller bandgap than that of top barrier 128. Further, during the epitaxial growth, cap layer 130 may be in-situ doped to a high (n-type) impurity concentration, which may be between about $1\times10^{19}/cm^3$ and about $1\times10^{20}/cm^3$, for example.

An optional etch stop layer 32 is formed between the first and the second groups of layers and may be formed by epitaxial growth. Etch stop layer 32 may be formed of a material having a high etching selectivity with the second group of layers, particularly buffer layer 222 and back-ground layer 223, wherein the selectivity (the etching rate of etching the second group of layers to the etching rate of etching etch stop layer 32) may be greater than about 50, or even greater than about 100. Etch stop layer 32 has a crystalline structure, and may also be formed of an epitaxial III-V compound semiconductor material.

The second group of layers may also be formed of III-V compound semiconductor materials, such as antimony-based materials. For example, channel layer 226 may be formed of InGaSb, while buffer layer 222, back-ground layer 223, bottom barrier 224, top barrier 228, and cap layer 230 may be formed of InGaAlSb, although the compositions and the process conditions for forming these layers may still be different from each other. For example, buffer layer 222 may be formed at a temperature lower than the temperature for forming back-ground layer 223. Top barrier 228 and cap layer 230 may be doped with a p-type impurity or an impurity that may cause top barrier 228 and cap layer 230 to be of p-type, such as beryllium, while channel layer 226 and bottom barrier 224 may be, or may not be, doped with any p-type impurity. Cap layer 230 (which is a contact layer) may have a smaller bandgap than that of top barrier 228. Further, during the epitaxial growth, cap layer 230 may be in-situ doped to a high (p-type) impurity concentration, which may be between about $1\times10^{19}/cm^3$ and about $1\times10^{20}/cm^3$, for example.

Bottom barriers 124/224 may have a thickness(es) between about 5 nm and about 10 nm, channel layers 126/226 may have a thickness(es) between about 2 nm and about 50 nm, and top barriers 128/228 may have a thickness(es) between about 5 nm and about 500 nm. It is realized, however, that the dimensions recited throughout the description are merely examples, and may be changed if different formation technologies are used.

Figure 2B:
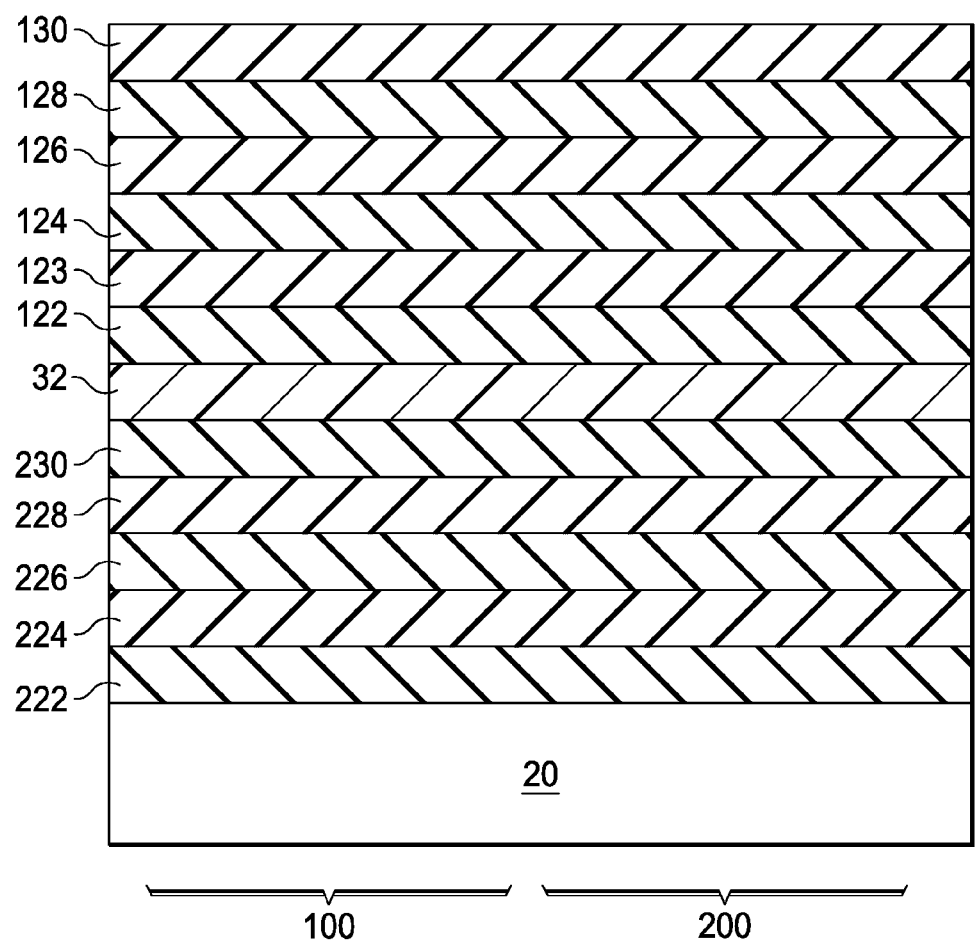

In alternative embodiments, as shown in FIG. 2B, the positions of the first group of layers (except back-ground layer 223) are swapped with the positions of the second group of layers. Accordingly, the p-type doped layers are formed below the n-type doped layers. In this embodiment, back-ground layer 123 may be added between layers 122 and 124, and may be doped with an n-type impurity, such as phosphorous. Back-ground layer 223, as shown in FIG. 2A, however, may be removed.

Figure 3:
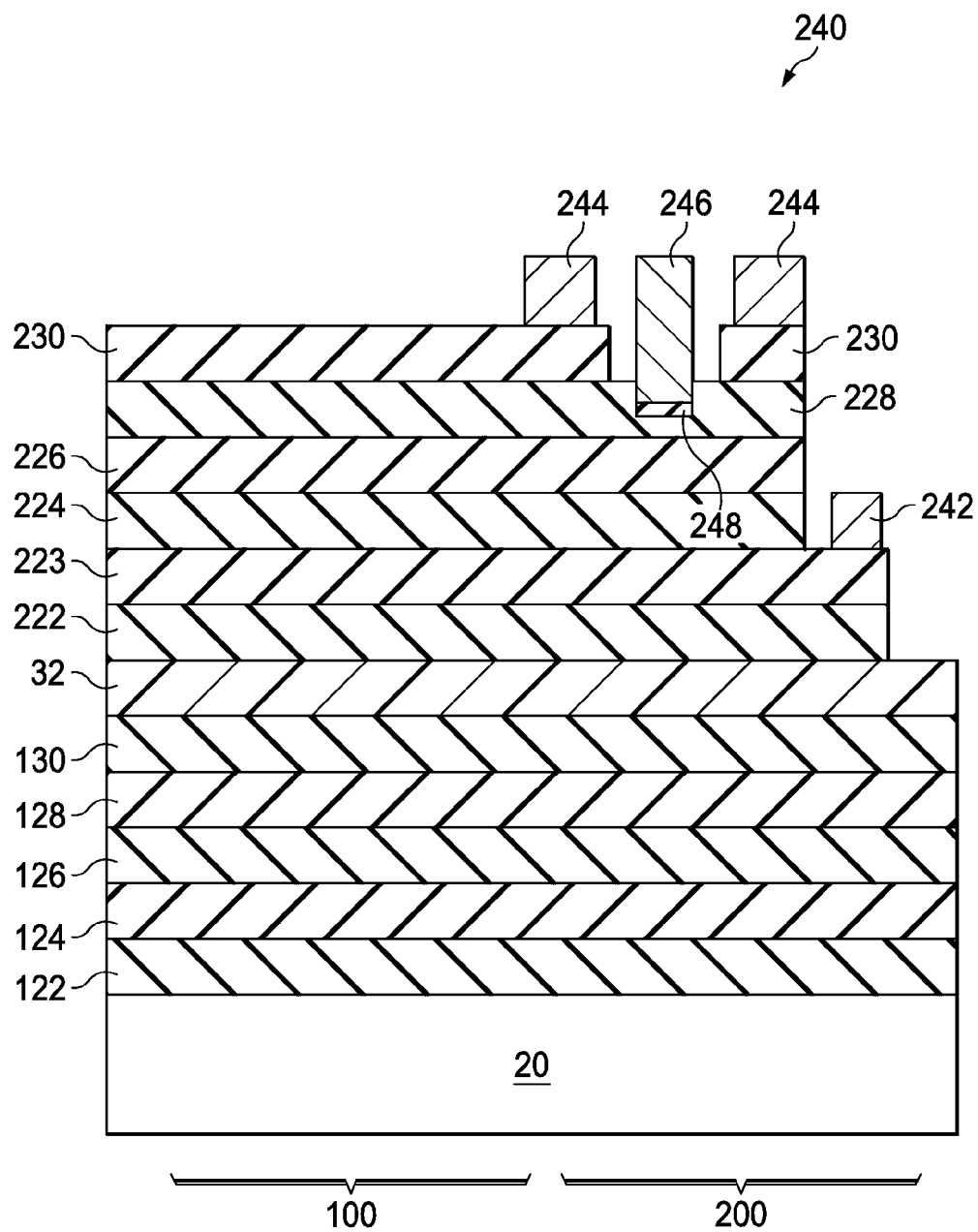

Referring to FIG. 3, upper FET 240 is formed in second device region 200, with a portion of channel layer 226 forming the channel region of upper FET 240. The formation of upper FET 240 may include patterning the second group of layers (the embodiment shown in FIG. 2A) or the first group of layers (the embodiment shown in FIG. 2B), forming back-ground contact 242, source and drain contacts 244, and gate electrode 246. Gate dielectric 248 is optionally formed. Back-ground contact 242, source and drain contacts 244, and gate electrode 246 may comprise a metal(s), such as nickel, aluminum, palladium, gold, and/or the like. Further, gate electrode 246 may be formed of doped polysilicon, metals, metal nitrides, metal silicides, and the like. Gate dielectric 248 may be formed of commonly used dielectric materials, such as silicon oxide, silicon nitride, oxynitrides, multi-layers thereof, and combinations thereof. Gate spacers (not shown) may also be formed on the sidewalls of gate dielectric 248 and gate electrode 246. The formation process of upper FET 240 may include etching into top barrier 228, and then forming gate dielectric 248 and gate electrode 246 in the recess. The details of the formation process may be appreciated from the structure and hence are not repeated herein.

Figure 4:
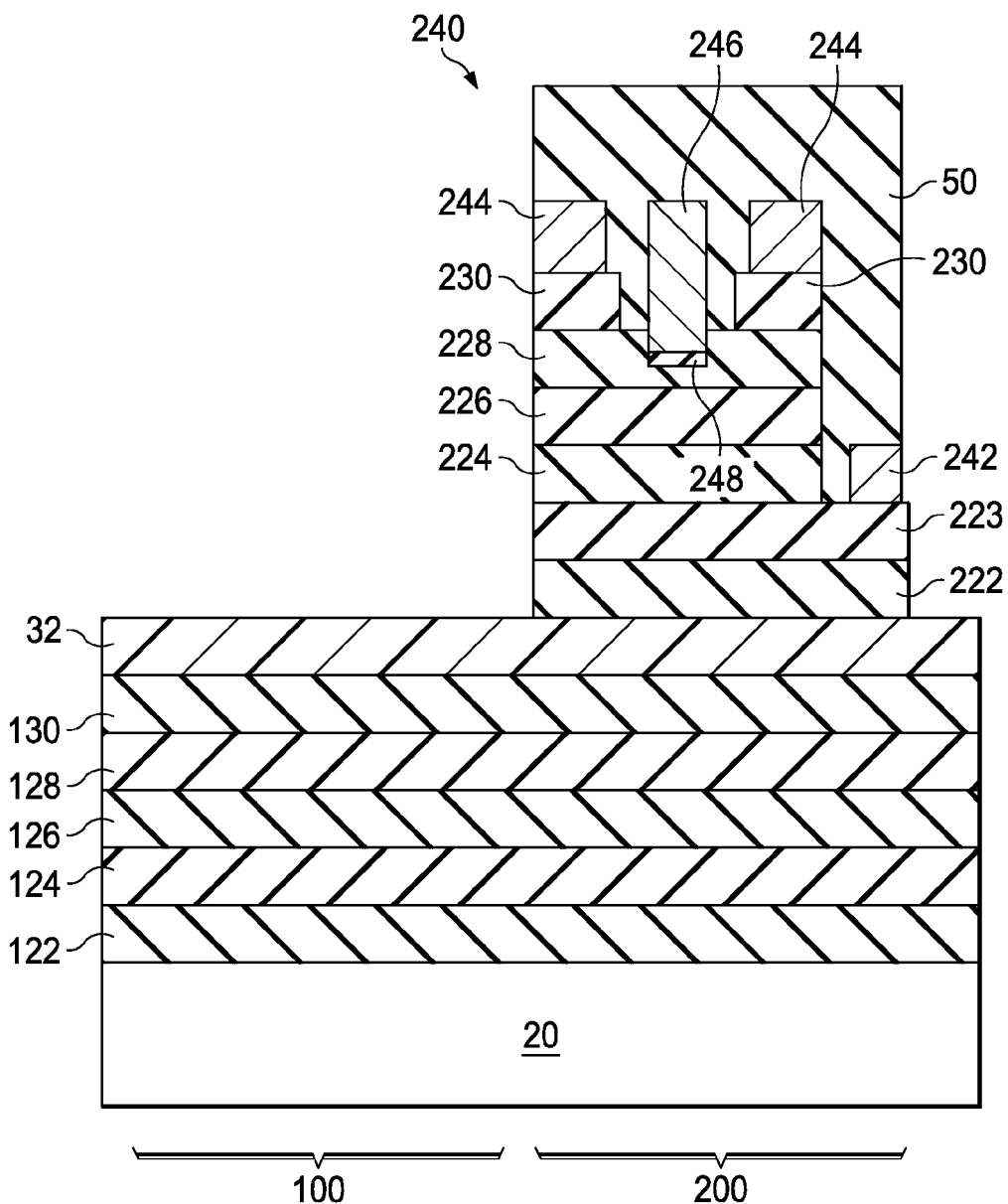

Next, as shown in FIG. 4, upper FET 240 is protected by protection layer 50, which may be formed of a polymer or other dielectric materials that is resistant to the etchant used for etching the second group of layers and etch stop layer 32. First device region 100 is not protected by protection layer 50. The second group of layers are then removed from first device region 100 using etch stop layer 32 to stop the etching.

Figure 5:
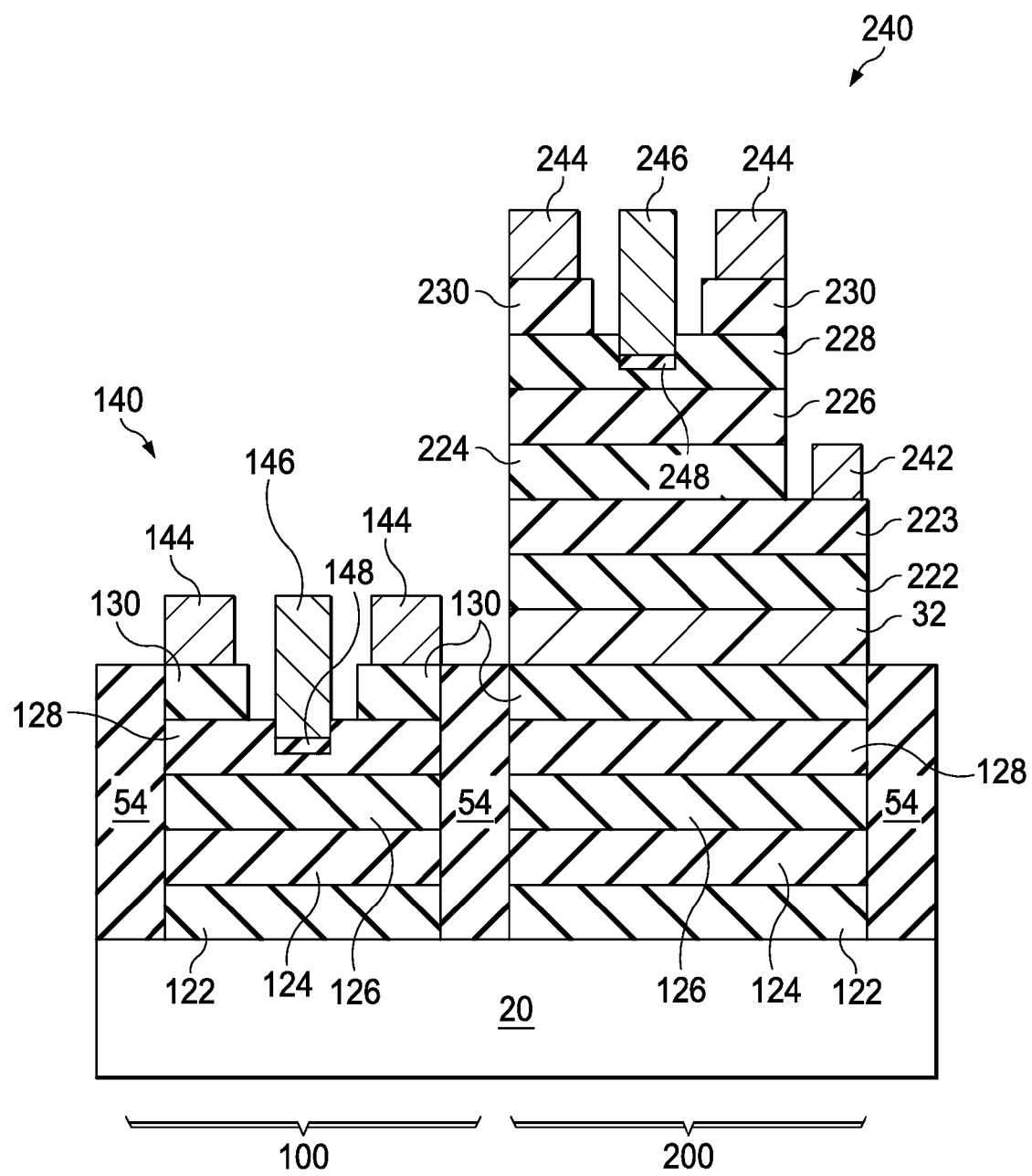

Etch stop layer 32 is then removed, as shown in FIG. 5. Next, lower FET 140 is formed in first device region 100, with a portion of channel layer 126 forming the channel region of lower FET 140. The formation of lower FET 140 may include patterning the first group of layers (in the embodiment shown in FIG. 2A) or the second group of layers (in the embodiment shown in FIG. 2B), forming source and drain contacts 144, and forming gate electrode 146. Again, gate dielectric 148 is optionally formed. Source and drain contacts 144 and gate electrode 146 may also be formed. Gate electrode 146 and gate dielectric 148 may be formed of essentially the same materials as for forming gate electrode 246 and gate dielectric 248, respectively. Alternatively, gate electrode 146 may be formed of a material having a lower work function than that of gate electrode 246. Gate spacers (not shown) may also be formed on the sidewalls of gate dielectric 148 and gate electrode 146. In alternative embodiments in which gate electrodes 146 and 246 are formed of a same material and gate dielectrics 148 and 148 are formed of a same material, they can be both be formed simultaneously.

After the formation of lower FET 140, protection layer 50 is removed. As a result, the complementary FETs, including upper FET 240 and lower FET 140, are formed. Insulation regions 54 may be filled into the gaps between lower FET 140 and upper FET 240. In an embodiment, as discussed above, upper FET 240 is of p-type while lower FET 140 is of n-type, and the corresponding complementary FETs are formed starting from the structure shown in FIG. 2A. In alternative embodiments, upper FET 240 is of n-type while lower FET 140 is of p-type, and the corresponding complementary FETs are formed starting from the structure shown in FIG. 2B. It may be observed from FIG. 5 that the layers that are used for forming lower FET 140, including bottom barrier 124, channel layer 126, and upper barrier 128, extend directly underlying the layers that are used for forming upper FET 240, including bottom barrier 224, channel layer 226, and upper barrier 228.

Figure 6A:
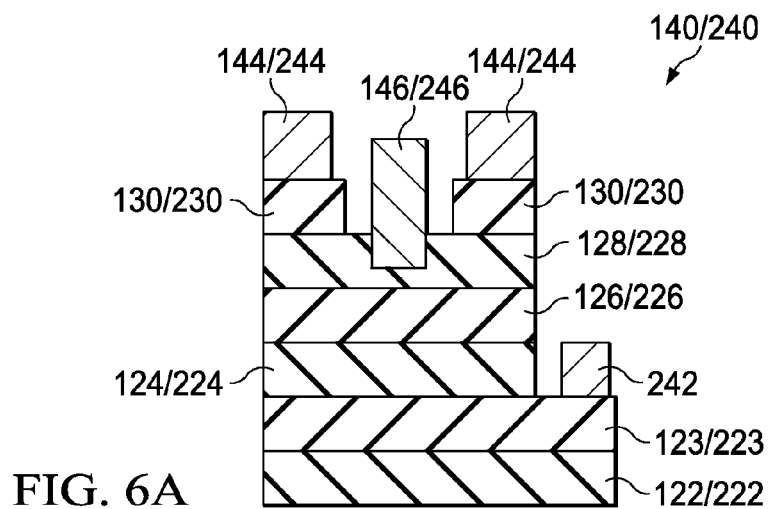
FIGS. 6A through 6C are cross-sectional views of FETs in accordance with alternative embodiments.
Figure 6B:
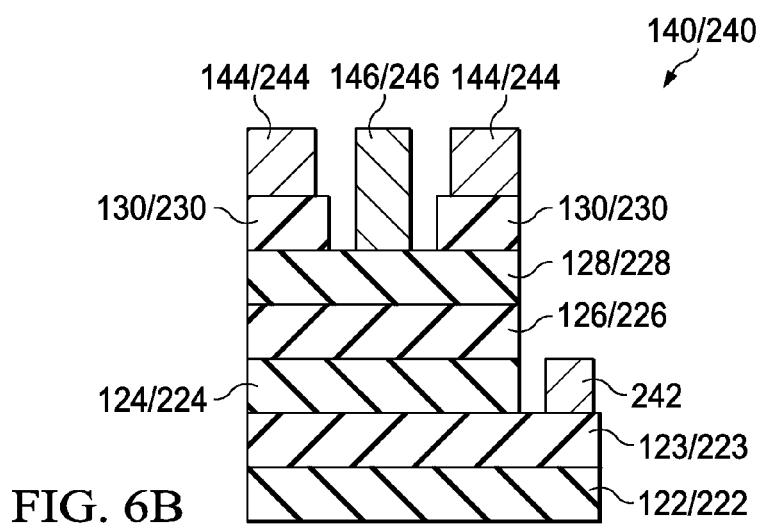
Figure 6C:
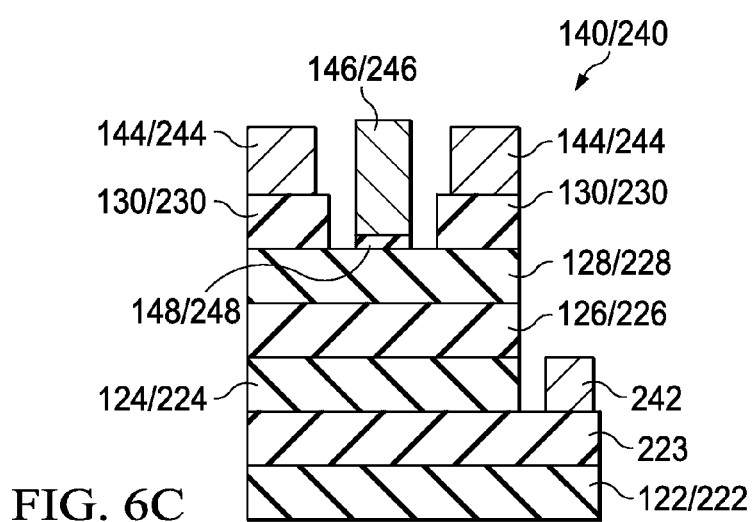

It is appreciated that other III-V compound semiconductor materials may be used to replace the materials for forming upper FET 240 and lower FET 140. Further, each of FETs 140/240 may have alternative structures. FIGS. 6A through 6C illustrate alternative structures of upper FET 240 and lower FET 140. In FIG. 5, upper FET 240 and/or lower FET 140 are enhancement mode metal-insulator-semiconductor FETs (E-mode MISFETs). As an alternative, FIG. 6A illustrates an enhancement mode hetero-structure FET (E-mode HFET), which does not include any gate dielectric. FIG. 6B illustrates a depletion mode hetero-structure FET (D-mode HFET, whose gate electrode 146/246 may not extend into top barrier 128/228), which does not include any gate dielectric. FIG. 6C illustrates a depletion mode MISFET (D-mode MIS- FET), which may not extend into top barrier 128/228, but does include gate dielectric 148/248.

In the formation of upper FET 240 and lower FET 140, antimony-based III-V semiconductor materials may be used to form channels. The antimony-based III-V semiconductor materials have high electron mobilities and high hole mobilities, and hence are suitable for forming NFETs and PFETs. Further, with the lattice constants of the first and/or the second group of layers greater than the lattice constant of substrate 20, compressive stresses may be generated in the channel of the PFET, and the hole mobility of the PFETs can be further increased. As a result, complementary FETs 140 and 240 not only have high drive currents as the result of high electron and hole mobilities, but also have balanced drive currents.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a substrate;
a first plurality of III-V semiconductor layers comprising:
 a first bottom barrier over the substrate;
 a first channel layer over the first bottom barrier; and
 a first top barrier over the first channel layer, the first top barrier having a first top surface;
a first field-effect transistor (FET) comprising a first channel region, wherein the first channel region comprises a portion of the first channel layer;
a second plurality of III-V semiconductor layers over the first plurality of III-V semiconductor layers and comprising:
 a second bottom barrier having a second top surface, the second top surface spaced from the first top surface in a direction orthogonal to a major surface of the substrate;
 a second channel layer over the second bottom barrier; and
 a second top barrier over the second channel layer; and
a second FET comprising a second channel region, wherein the second channel region comprises a portion of the second channel layer.

2. The integrated circuit structure of claim 1, wherein the first FET and the second FET comprise an NFET and a PFET.

3. The integrated circuit structure of claim 2, wherein the substrate is a semiconductor substrate having a lattice constant smaller than a lattice constant of a channel layer of the PFET.

4. The integrated circuit structure of claim 2, wherein one of the first channel layer and the second channel layer forming the channel region of the PFET is formed of InGaSb, and wherein a remaining one of the first channel layer and the second channel layer forming the channel region of the NFET is formed of InAsSb.

5. The integrated circuit structure of claim 1, wherein the first channel layer and the second channel layer are antimony-based.

6. The integrated circuit structure of claim 1 further comprising an etch stop layer between the first plurality of III-V semiconductor layers and the second plurality of III-V semiconductor layers.

7. The integrated circuit structure of claim 6, wherein an etching selectivity of the second plurality of III-V semiconductor layers to the etch stop layer is greater than about 50.

8. The integrated circuit structure of claim 1, wherein one of the first FET and the second FET is an enhancement mode FET comprising a gate electrode extending into a recess in the respective one of the first top barrier and the second top barrier.

9. The integrated circuit structure of claim 1, wherein one of the first FET and the second FET is a depletion mode FET.

10. The integrated circuit structure of claim 1, wherein one of the first FET and the second FET comprises a gate electrode contacting the respective one of the first top barrier and the second top barrier.

11. The integrated circuit structure of claim 1, wherein one of the first FET and the second FET comprises a gate electrode separated from the respective one of the first top barrier and the second top barrier by a gate dielectric.

12. An integrated circuit structure comprising:
a semiconductor substrate;
a first plurality of III-V semiconductor layers comprising:
 a first bottom barrier over the semiconductor substrate;
 a first channel layer over the first bottom barrier and formed of InAsSb; and
 a first top barrier over the first channel layer;
an n-type field-effect transistor (NFET) comprising a first channel region, wherein the first channel region comprises a portion of the first channel layer;
an etch stop layer over the first plurality of III-V semiconductor layers;
a second plurality of III-V semiconductor layers over the etch stop layer and comprising:
 a second bottom barrier;
 a second channel layer over the second bottom barrier and formed of InGaSb; and
 a second top barrier over the second channel layer; and
a p-type field-effect transistor (PFET) comprising a second channel region, wherein the second channel region comprises a portion of the second channel layer.

13. The integrated circuit structure of claim 12, wherein the semiconductor substrate has a lattice constant smaller than a lattice constant of the second channel layer.

14. The integrated circuit structure of claim 12, wherein the first bottom barrier, the first top barrier, the second bottom barrier, and the second top barrier are formed of InGaAlSb.

15. The integrated circuit structure of claim 12, wherein an etching selectivity of the second plurality of III-V semiconductor layers to the etch stop layer is greater than about 50.

16. The integrated circuit structure of claim 12 further comprising a cap layer lower than the etch stop layer and over the first top barrier, wherein the cap layer is doped with an n-type impurity, and wherein portions of the cap layer form portions of source and drain contacts of the NFET.

17. The integrated circuit structure of claim 12 further comprising a cap layer higher than the second top barrier, wherein the cap layer is doped with a p-type impurity, and wherein portions of the cap layer form portions of source and drain contacts of the PFET.

18. An integrated circuit structure comprising:
   a semiconductor substrate having a first lattice constant;
   a first bottom barrier over the semiconductor substrate and comprising a first portion and a second portion;
   a first channel layer over the first bottom barrier and comprising a first portion and a second portion;
   a first top barrier over the first channel layer and comprising a first portion and a second portion;
   an first field-effect transistor (FET) comprising the first portion of the first channel layer as a channel region;
   an etch stop layer directly over the second portions, and not directly over the first portions, of the first top barrier, the first channel layer, and the first bottom barrier;
   a second bottom barrier directly over the etch stop layer;
   a second channel layer directly over the second bottom barrier, wherein one of the first channel layer and the second channel layer is formed of InAsSb, and the other is formed of InGaSb;
   a second top barrier directly over the second channel layer; and
   a second FET comprising a portion of the second channel layer as a channel region.

19. The integrated circuit structure of claim 18, wherein the first FET is an NFET, and the first channel layer is formed of InAsSb, and wherein the second FET is a PFET, and the second channel layer is formed of InGaSb.

20. The integrated circuit structure of claim 18, wherein the first FET is a PFET, and the first channel layer is formed of InGaSb, and wherein the second FET is an NFET, and the second channel layer is formed of InAsSb.

* * * * *